US009826615B2

(12) United States Patent
Su et al.

(10) Patent No.: US 9,826,615 B2
(45) Date of Patent: Nov. 21, 2017

(54) EUV COLLECTOR WITH ORIENTATION TO AVOID CONTAMINATION

(71) Applicant: Taiwan Semiconductor Manufacturing Co., Ltd., Hsin-Chu (TW)

(72) Inventors: Jian-Yuan Su, Taichung (TW); Hung-Ming Kuo, Chubei (TW); Kuo-Hung Chao, Hsinchu (TW); Jui-Chun Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/860,866

(22) Filed: Sep. 22, 2015

(65) Prior Publication Data

US 2017/0086283 A1 Mar. 23, 2017

(51) Int. Cl.
*H05G 2/00* (2006.01)
*G03F 7/20* (2006.01)
*G03F 7/00* (2006.01)
*G21K 1/06* (2006.01)

(52) U.S. Cl.
CPC .............. *H05G 2/008* (2013.01); *G03F 7/00* (2013.01); *G03F 7/70033* (2013.01); *G03F 7/70916* (2013.01); *H05G 2/005* (2013.01); *G21K 1/062* (2013.01)

(58) Field of Classification Search
None
See application file for complete search history.

(56) References Cited

U.S. PATENT DOCUMENTS

| | | | | |
|---|---|---|---|---|
| 8,288,743 | B2* | 10/2012 | Ueno | G03F 7/70033 250/424 |
| 8,809,823 | B1 | 8/2014 | Senekerimyan et al. | |
| 2002/0162975 | A1* | 11/2002 | Orsini | B82Y 10/00 250/504 R |
| 2004/0180270 | A1* | 9/2004 | Heerens | G03F 1/66 430/5 |

(Continued)

FOREIGN PATENT DOCUMENTS

JP 2007088267 A * 4/2007 ........... H01L 21/027

OTHER PUBLICATIONS

Electronic Video by Cymer. "How an EUV Light Source Works." Published on May 4, 2012. Please go to the following link to watch the video: https://www.youtube.com/watch?v=8xJEs3a-1QU&feature=player_embedded.

*Primary Examiner* — Michael Logie
(74) *Attorney, Agent, or Firm* — Eschweiler & Potashnik, LLC

(57) ABSTRACT

The present disclosure relates to an extreme ultraviolet (EUV) radiation source having a collector mirror oriented to reduce contamination of fuel droplet debris. In some embodiments, the EUV radiation source has a fuel droplet generator that provides a plurality of fuel droplets to an EUV source vessel. A primary laser is configured to generate a primary laser beam directed towards the plurality of fuel droplets. The primary laser beam has a sufficient energy to ignite a plasma from the plurality of fuel droplets, which emits extreme ultraviolet radiation. A collector mirror, configured to focus the extreme ultraviolet radiation to an exit aperture of the EUV source vessel, which is oriented so that a normal vector extending outward from a vertex of the collector mirror intersects a direction of a gravitation force by an angle that is less than 90°.

20 Claims, 4 Drawing Sheets

(56) References Cited

U.S. PATENT DOCUMENTS

| | | | |
|---|---|---|---|
| 2006/0011870 A1* | 1/2006 | Yamamoto | B82Y 10/00 250/504 R |
| 2008/0210889 A1* | 9/2008 | Suganuma | G03F 7/70916 250/504 R |
| 2009/0230326 A1* | 9/2009 | Vaschenko | H05G 2/003 250/492.2 |
| 2009/0261242 A1* | 10/2009 | Ueno | G03F 7/70033 250/283 |
| 2010/0039631 A1* | 2/2010 | Loopstra | G03F 7/70033 355/67 |
| 2010/0051832 A1* | 3/2010 | Nishisaka | G03F 7/70033 250/504 R |
| 2010/0085547 A1* | 4/2010 | Labetski | H05G 2/003 355/53 |
| 2010/0140512 A1* | 6/2010 | Suganuma | G03F 7/70033 250/504 R |
| 2011/0026002 A1* | 2/2011 | Loopstra | G03F 7/70033 355/71 |
| 2012/0217414 A1* | 8/2012 | Ueno | G03F 7/70033 250/396 ML |
| 2013/0105712 A1* | 5/2013 | Yanagida | H05G 2/003 250/504 R |
| 2014/0253894 A1* | 9/2014 | Van Schoot | G03F 7/70033 355/67 |
| 2015/0293456 A1* | 10/2015 | Dijksman | H05G 2/005 355/67 |
| 2015/0338753 A1* | 11/2015 | Riepen | G03F 7/70033 250/504 R |
| 2016/0192470 A1* | 6/2016 | Iwamoto | G03F 7/70908 250/504 R |

\* cited by examiner

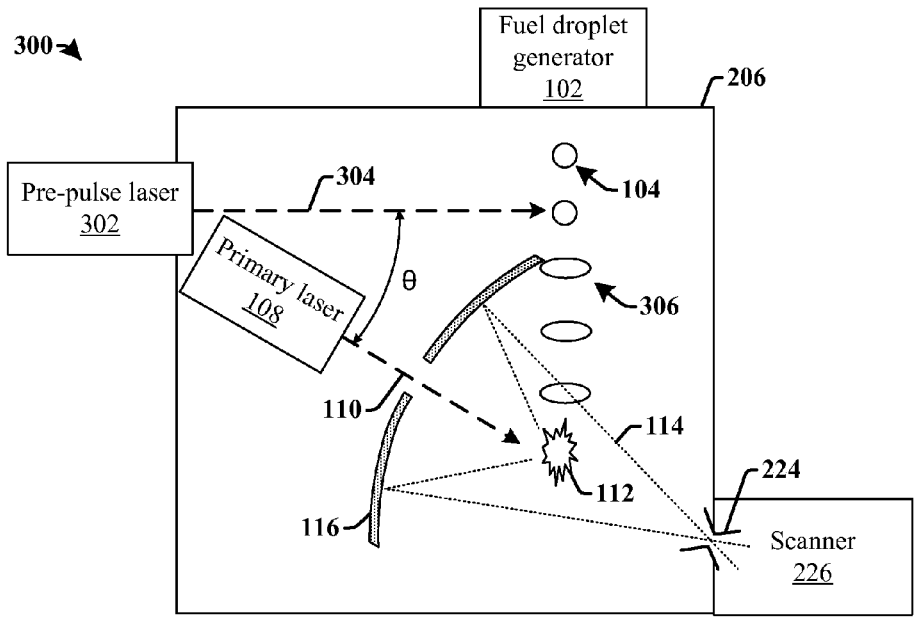
Fig. 3
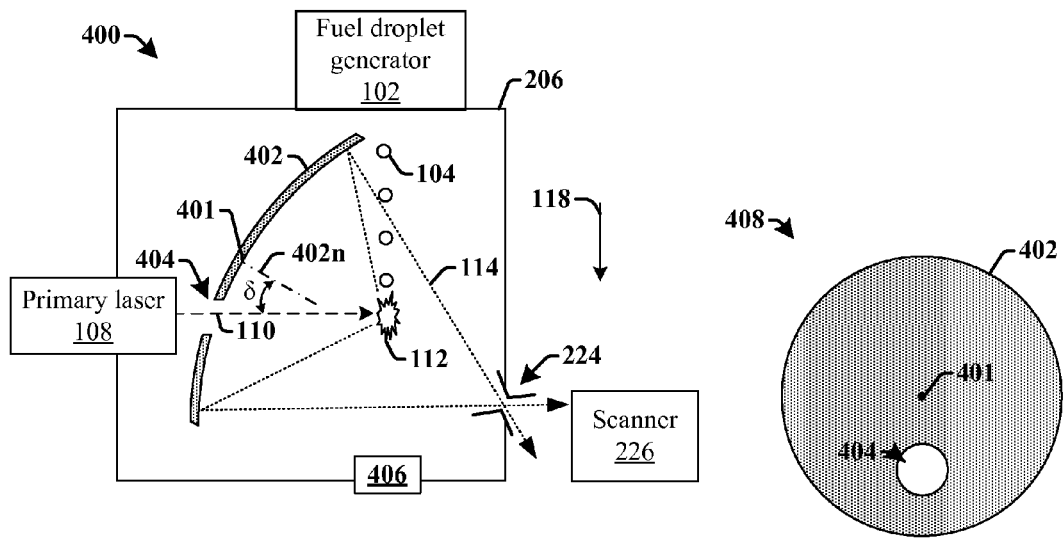
Fig. 4A  Fig. 4B

EUV COLLECTOR WITH ORIENTATION TO AVOID CONTAMINATION

BACKGROUND

Photolithography is a process by which a photomask having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light having an exposure wavelength of between 10 nm and 130 nm, is a promising next-generation lithography solution for emerging technology nodes (e.g., 22 nm, 14 nm, 10 nm, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a block diagram of some additional embodiments of an EUV radiation source having a pre-pulse laser.

FIGS. 4A-4B illustrate a block diagram of some alternative embodiments of an EUV radiation source having a collector mirror oriented to reduce contamination by fuel droplet debris.

DETAILED DESCRIPTION

Figure 1:
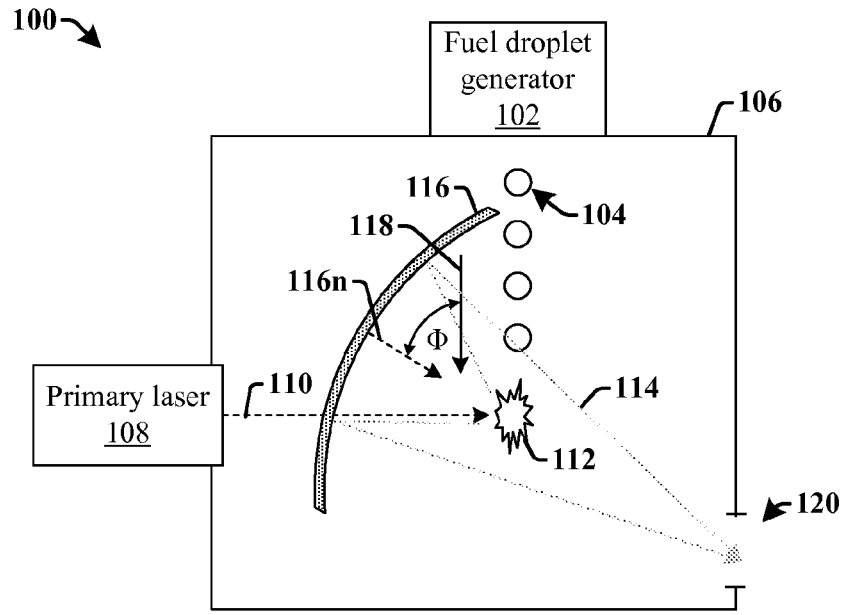
FIG. 1 illustrates a block diagram of some embodiments of an extreme ultraviolet (EUV) radiation source having a collector mirror oriented to reduce contamination by fuel droplet debris.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) photolithography systems generally use extreme ultraviolet radiation having a 13.5 nm wavelength. One method of producing 13.5 nm wavelength radiation that has recently emerged is to shot a carbon dioxide ($CO_2$) laser beam at droplets of tin (Sn). The tin droplets are typically provided into an EUV source vessel. As the droplets enter the EUV source vessel, the $CO_2$ laser beam hits the tin droplets and heats the tin droplets to a critical temperature that causes atoms of tin to shed their electrons and become a plasma of ionized tin droplets. The ionized tin droplets emit EUV radiation comprising photons having a wavelength of approximately 13.5 nm.

A curved collector mirror is used to focus the EUV radiation to a downstream a scanner having optical components configured to focus the EUV radiation onto a semiconductor workpiece. In modern day EUV radiation sources, the collector mirror is oriented to face upwards such that the plasma of ionized tin droplets is formed over the collector mirror. It has been appreciated that when the tin droplets are struck by the $CO_2$ laser, debris from the collision may be ejected from the plasma and fall onto the collector mirror due to gravity. As the debris collects on the collector mirror, the collector mirror loses reflectivity. Therefore, to maintain high EUV energy, the collector mirror is replaced often. However, replacement of the collector mirror is a time intensive process that reduces throughput of the EUV radiation source. For example, a collector mirror may have to be replaced every month and may take up to 5 days to replace, thereby significantly reducing throughput of the EUV radiation source.

The present disclosure relates to an EUV radiation source having a collector mirror oriented to reduce contamination by fuel droplet debris, and an associated method. In some embodiments, the EUV radiation source has a fuel droplet generator that provides a plurality of fuel droplets to an EUV source vessel. A primary laser is configured to generate a primary laser beam directed towards the plurality of fuel droplets. The primary laser beam has a sufficient energy to ignite a plasma from the plurality of fuel droplets, which emits extreme ultraviolet radiation. A collector mirror, configured to focus the extreme ultraviolet radiation to an exit aperture of the EUV source vessel, which is oriented so that a normal vector extending outward from a vertex of the collector mirror intersects a direction of a gravitation force by an angle that is less than 90°. Such an orientation of the collector mirror prevents debris from the fuel droplets from falling onto the collector mirror, thereby reducing build-up of debris on the collector mirror and improving throughput of the EUV radiation source.

FIG. 1 illustrates a block diagram of some embodiments of an extreme ultraviolet (EUV) radiation source 100 having a collector mirror oriented to reduce contamination by fuel droplet debris.

The EUV radiation source 100 comprises a fuel droplet generator 102 configured to generate a plurality of fuel droplets 104. The plurality of fuel droplets 104 generated by the fuel droplet generator 102 are provided into an EUV source vessel 106. In some embodiments, the plurality of fuel droplets 104 may comprise tin (Sn). In other embodiments, the plurality of fuel droplets 104 may comprise a different metal material.

A primary laser 108 is configured to generate a primary laser beam 110 that intersects the fuel droplets 104. In some embodiments, the primary laser 108 may comprise a carbon dioxide ($CO_2$) laser. In other embodiments, the primary laser 108 may comprise alternative types of lasers. When the primary laser beam 110 strikes the plurality of fuel droplets 104, the primary laser beam 110 heats the plurality of fuel droplets 104 to a critical temperature. At the critical temperature, the fuel droplets 104 shed their electrons and become a plasma 112 comprising a plurality of ions. The plurality of ions emit EUV radiation 114 (e.g., having a wavelength of approximately 13.5 nm).

A collector mirror 116 is arranged within the EUV source vessel 106. The collector mirror 116 has a concave curvature that curves around the intersection of the plurality of fuel droplets 104 and the primary laser beam 110, which is configured to focus the EUV radiation 114 to an exit aperture 120 of the EUV source vessel 106. The collector mirror 116 is oriented to have a normal vector 116n that extends outward from the vertex of the collector mirror 116 (i.e., the geometric center of the collector mirror 116), along a principal axis of the collector mirror 116. In other words, the normal vector 116n extends perpendicular to a surface of the collector mirror 116 at the vertex. The collector mirror 116 is oriented so that the normal vector 116n intersects a direction of a gravitation force 118 by an angle Φ that is less than or equal to 90°. In some embodiments, the angle Φ is less than 90°. For example, in some embodiments the angle Φ may be less than approximately 85°. In some alternative embodiments, the angle Φ may be less than approximately 60°.

Because the collector mirror 116 is oriented so as to have a normal vector 116n that intersects the direction of the gravitation force 118 by an angle Φ that is less than or equal to 90°, the collector mirror 116 has a vertex that is located at a position that is laterally adjacent to and/or above the plasma 112. This location prevents debris from the fuel droplets 104 from falling (i.e., being accelerated by the force of gravity) onto the collector mirror 116 (e.g., directly or off of interior surfaces of the EUV source vessel 106), thereby reducing build-up of debris on the collector mirror 116 and reducing the frequency at which the collector mirror 116 has to be replaced (i.e., reducing downtime and improving throughput of an EUV tool using EUV radiation source 100).

Figure 2:
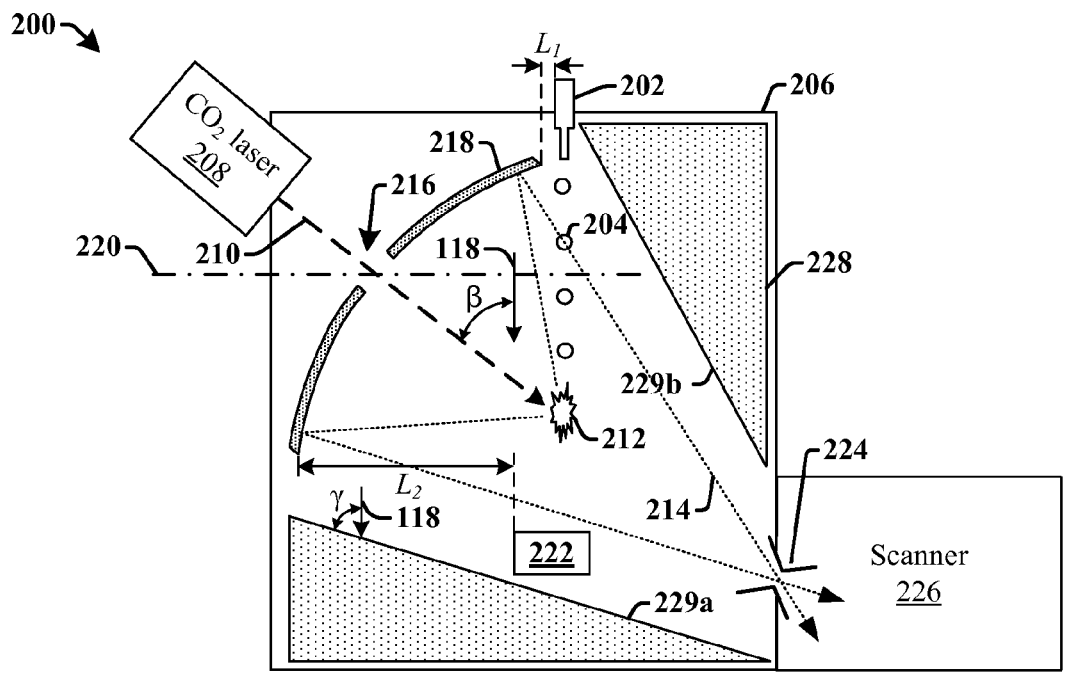
FIG. 2 illustrates some additional embodiments of an EUV radiation source having a collector mirror oriented to reduce contamination by fuel droplet debris.

FIG. 2 illustrates a block diagram of some additional embodiments of an EUV radiation source 200 having an angled primary laser.

The EUV radiation source 200 comprises a tin droplet generator 202 configured to generate a plurality of tin droplets 204 and to provide the plurality of tin droplets 204 to an EUV source vessel 206 along a first trajectory. In some embodiments, the first trajectory may in a substantially same direction as a gravitation force 118. In other embodiments, the first trajectory may be in a different direction than the gravitation force 118. The EUV source vessel 206 comprises a processing chamber held under vacuum (e.g., at a pressure of less than $10^{-2}$ mbar).

A carbon dioxide ($CO_2$) primary laser 208 is configured to generate a primary laser beam 210. The primary laser beam 210 may comprise a plurality of pulses of infrared light. In some embodiments, the primary laser beam 210 may have principal wavelength bands centered around a range of between approximately 9 um and approximately 11 um and an energy of greater than or equal to approximately 11.9 MeV. The primary laser beam 210 strikes the plurality of tin droplets 204 to form a plasma 212 that emits EUV radiation 214. In some embodiments, the EUV radiation 214 may have a wavelength of approximately 13.5 nm.

The primary laser beam 210 extends through an opening 216 in a collector mirror 218 located within the EUV source vessel 206. The collector mirror 218 comprises a concave curvature and is oriented to have a normal vector that is rotated with respect to a horizontal line (e.g., extending in a second direction perpendicular to the gravitation force 118) by a non-zero angle. In some embodiments, the collector mirror 218 may comprise a multi-layer coating having alternating layers of different materials. For example, in some embodiments, the collector mirror 218 may comprise alternating layers of molybdenum and silicon configured to operate as a Bragg reflector.

In some embodiments, the opening 216 in the collector mirror 218 is located along a vertex of the collector mirror 218. In such embodiments, the primary laser beam 210 follows a trajectory that extends in a direction that intersects a direction of the gravitation force 118 at an angle β of less than approximately 90°. In some embodiments, the primary laser beam 210 is configured to intersect the plurality of tin droplets 204 at an intersection point that is located vertically below a horizontal line 220 extending through a vertex (i.e., center) of the collector mirror 218. Because of the orientation of the collector mirror 218, such an intersection point allows for the EUV radiation 214 to be efficiently collected by the collector mirror 218.

In some embodiments, a tin droplet collection element 222 may be located below the tin droplet generator 202 and the collector mirror 218. The tin droplet collection element 222 is configured to collect tin droplets that are not vaporized during formation of the EUV radiation 214 and/or fragments of tin droplets generated during formation of the EUV radiation 214. In some embodiments, the tin droplet generator 202 and the tin droplet collection element 222 are aligned along a line that intersects a trajectory of the primary laser beam 210 by the angle that is less 90°. In some embodiments, a first side of the collector mirror 218 is separated from the tin droplet generator 202 by a first lateral distance $L_1$, and a second opposite side of the collector mirror 218 is separated from the tin droplet collection element 222 by a second lateral distance $L_2$ that is larger than the first lateral distance $L_1$.

The concave curvature of the collector mirror 218 focuses the EUV radiation 214 generated by the plasma 212 toward an intermediate focus (IF) unit 224 comprised within an exit aperture of the EUV source vessel 206. The intermediate focus unit 224 is located between the EUV source vessel 206 and a scanner 226 comprising optical elements configured to direct the EUV radiation 214 to a workpiece (e.g., a semiconductor substrate). In some embodiments, the intermediate focus unit 224 may comprise a cone shaped aperture configured to provide for separation of pressures between the EUV source vessel 206 and the scanner 226. In some embodiments, the intermediate focus unit 224 may extend into the scanner 226. In some embodiments, a line bisecting the intermediate focus unit 224 may be aligned with the normal vector of the collector mirror 218, so that the opening of the intermediate focus unit 224 within the scanner 226 faces downward.

In some embodiments, the EUV source vessel 206 may further comprise a tin debris collection element 228 having one or more angled surfaces 229a, 229b extending between the collector mirror 218 and the intermediate focus unit 224. The one or more angled surfaces 229a, 229b are configured to collect debris (e.g., tin droplet atoms) from the plasma 212. In some embodiments, a lower angled surface 229a vertically underlies the collector mirror 218. In such embodiments, a vertical distance between the lower angled surface 229a and a bottom of the collector mirror 218 increases as a lateral distance between the lower angled surface 229a and the bottom of the collector mirror 218 increases. In some additional embodiments, the lower angled surface 229a intersects the direction of gravitational force 118 at a second angle γ that is larger than the angle β. In some embodiments, the one or more angled surfaces 229a, 229b may comprise corrugated surfaces configured to collect tin droplet atoms from the plasma 212. The corrugated surfaces increase a surface area of the one or more angled surfaces 229a, 229b so that debris from the plasma 212 can be more efficiently collected.

FIG. 3 illustrates a block diagram of some additional embodiments of an extreme ultraviolet (EUV) radiation source 300 having a pre-pulse laser.

The EUV radiation source 300 comprises a pre-pulse laser 302 configured to generate a pre-pulse laser beam 304 that is incident on a plurality of fuel droplets 104 generated by a fuel droplet generator 102. The pre-pulse laser beam 304 has an energy that is less than a primary laser beam 110 generated by a primary laser 108. The energy of the pre-pulse laser beam 304 is insufficient to ignite a plasma from the fuel droplets 104 (e.g., is less than 11.9 MeV), but does deform the fuel droplets 104 (e.g., increase a target size/diameter of the tin droplets) to generate deformed fuel droplets 306. In some embodiments, the pre-pulse laser 302 may comprise a carbon-dioxide ($CO_2$) laser that has a lower energy than the primary laser 108.

In some embodiments, the pre-pulse laser beam 304 may extend in a first direction, while the primary laser beam 110 extends in a second direction that is not parallel to the first direction. In some embodiments, the first and second directions may be separated by an angle θ that is in a range of between 0° and 90°.

FIGS. 4A-4B illustrate some alternative embodiments of an EUV source comprising a collector mirror that is oriented to prevent contamination.

FIG. 4A illustrates a block diagram of some additional embodiments of a block diagram of an extreme ultraviolet (EUV) radiation source 400.

The EUV radiation source 400 comprises a primary laser beam 110 that extends through an opening 404 in a collector mirror 402 located within the EUV source vessel 206. The opening 404 within the collector mirror 402 is offset from a vertex 401 of the collector mirror 402, so that the opening 404 is located at a position that is asymmetric with respect to the curvature of the collector mirror 402. A normal vector 402n extending outward from the vertex 401 along a principal axis of the collector mirror 402 intersects the primary laser beam 110 at a non-parallel angle δ that is between 0° and 90°.

In some embodiments, the opening 404 is located at a position that is vertically between the vertex 401 of the collector mirror 402 and a fuel droplet collection element 406. In some embodiments, the opening 404 is located at a location within the collector mirror 402, which allows for the primary laser beam 210 to extend along a horizontal direction that is substantially perpendicular to a direction of the gravitational force 118. In some such embodiments, the primary laser beam 210 may be substantially parallel to a pre-pulse laser beam (e.g., corresponding to pre-pulse laser beam 304 shown in FIG. 3).

FIG. 4B illustrates a front-view 408 of the collector mirror 402 of FIG. 4A. As shown in front-view 408, the opening 404 within the collector mirror 402 is offset from a vertex 401 of the collector mirror 402. Although the opening 404 is illustrated as a circular opening, it will be appreciated that in alternative embodiments, the opening 404 may have different non-circular shapes.

Figure 5:
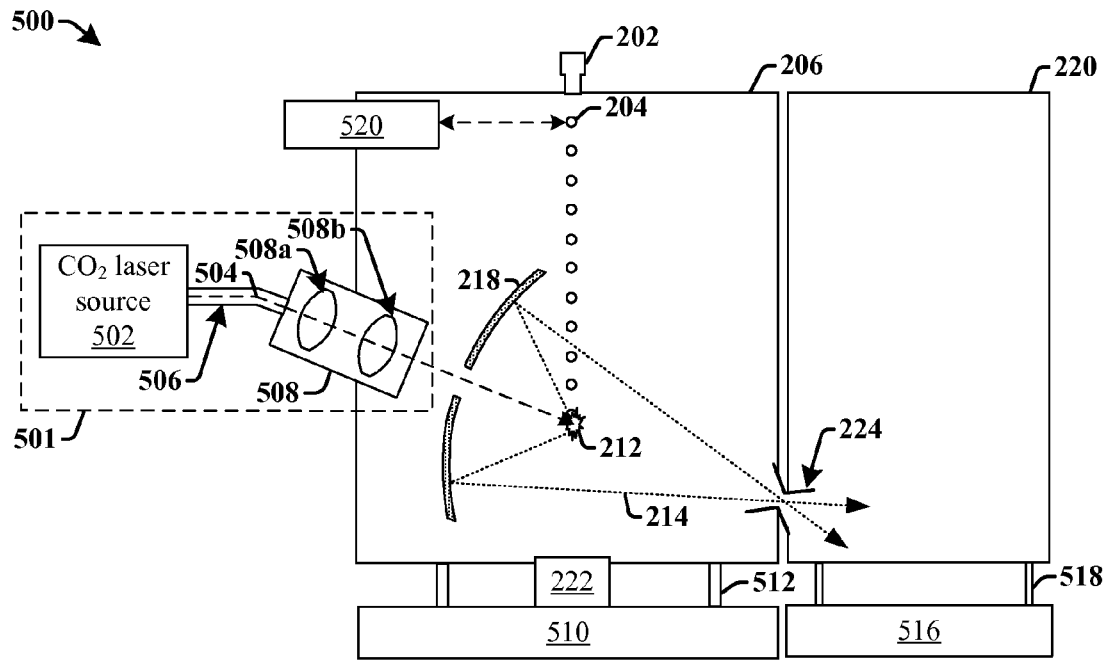
FIG. 5 illustrates a block diagram of some embodiments of an EUV photolithography system having a collector mirror oriented to reduce contamination by fuel droplet debris.

FIG. 5 illustrates a block diagram of some additional embodiments of an EUV lithography system 500.

The EUV lithography system 500 comprises a primary laser 501 having a $CO_2$ laser source 502 configured to produce a laser beam 504. In some embodiments, the $CO_2$ laser source 502 may comprise a multi-stage laser having a plurality of stages configured to amplify laser light produced by a prior stage. The laser beam 504 passes through a beam transport system 506 configured to provide the laser beam to a focusing system 508. The focusing system 508 comprises one or more lenses 508a, 508b and/or mirrors arranged within a beam line and configured to focus the laser beam 504. The laser beam 504 is output from the focusing system 508 to an EUV source vessel 206. In some embodiments, the EUV source vessel 206 may be coupled to an underlying source pedestal 510 by one or more damping elements 512.

The laser beam 504 follows a trajectory that intersects a plurality of tin droplets 204 provided from a tin droplet generator 202, located within a ceiling of the EUV source vessel 206, to form a plasma 212 that emits EUV radiation 214. The EUV radiation 214 is reflected by a collector mirror 218 to an intermediate focus unit 224 that provides a connection to a scanner 226. The collector mirror 218 oriented so that a normal vector extending outward from a vertex of the collector mirror 218 intersects a direction of a gravitation force by an angle that is less than 90°

The scanner 226 comprises an optical train having a plurality of optical elements (e.g., lenses and/or mirrors) configured to scan the EUV radiation 214 along a surface of a semiconductor workpiece. The optical train of the scanner 226 may be held under vacuum (e.g., at a pressure of less than $10^{-2}$ mbar) to avoid attenuation of the EUV radiation 214. In some embodiments, the scanner 226 may be coupled to an underlying scanner pedestal 516 by one or more damping elements 518.

In some embodiments, the EUV lithography system 500 may comprise a droplet metrology system 520 configured to determine the position and/or trajectory of the plurality of tin droplets 204. In some embodiments, the information from the droplet metrology system 520 may be provided to the focusing system 508, which can make adjustments to the position of the laser beam 504 to intersect the first trajectory of the plurality of tin droplets 204.

Figure 6:
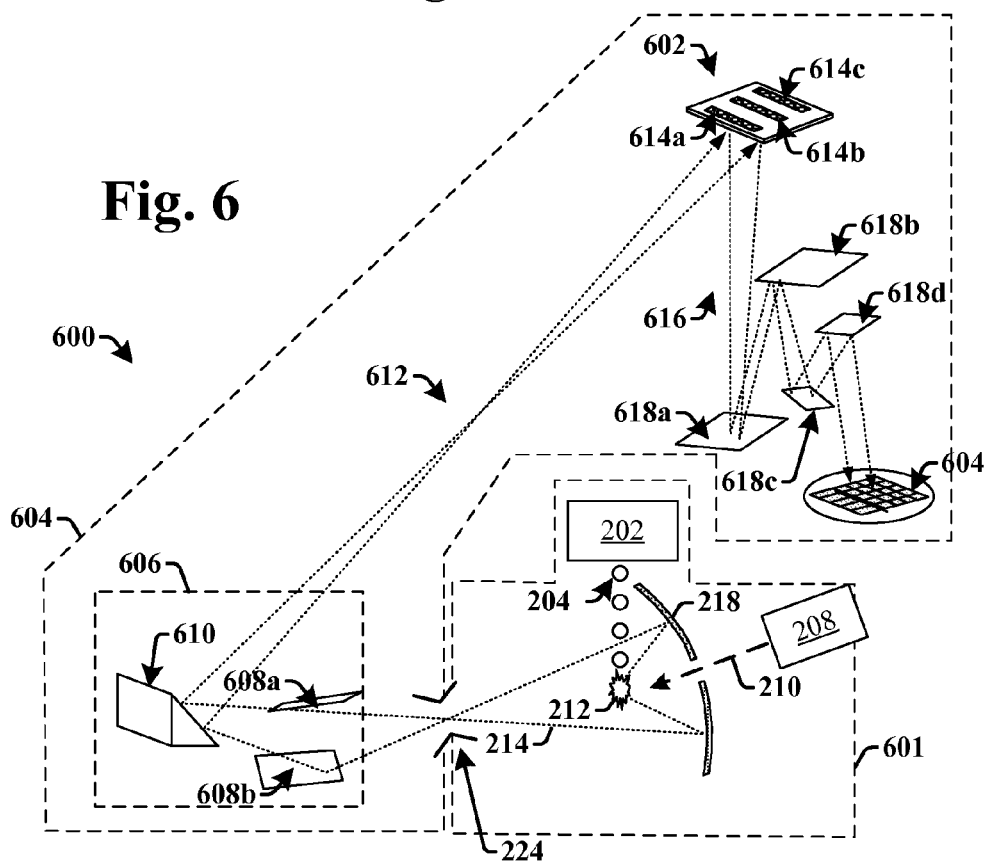
FIG. 6 illustrates a block diagram of some additional embodiments of an EUV photolithography system.

FIG. 6 illustrates a block diagram of some additional embodiments of an EUV photolithography system 600. Although the EUV photolithography system 600 is illustrated as having a certain configuration of components, it will be appreciated that the disclosed EUV radiation source may be implemented in EUV photolithography systems having additional components (e.g., additional mirrors) or having less components (e.g., less mirrors).

The EUV photolithography system 600 comprises EUV radiation source 601 configured to supply EUV radiation 214 (i.e., with wavelengths in a range of between about 10 nm and about 130 nm) to an EUV photomask 602 having a patterned multi-layered reflective surface (e.g., comprising alternating layers of molybdenum and silicon). In some embodiments, the EUV radiation source 601 is configured to generate the EUV radiation 214 by hitting tin droplets 204 with a primary laser beam 210 to generate a plasma 212 comprising ions that emit photons at a wavelength of between approximately 10 nm and approximately 130 nm.

The EUV radiation 214 output from the EUV radiation source 601 is provided to a condenser 606 by way of an intermediate focus unit 224. In some embodiments, the condenser 606 comprises first and second surfaces, 608a and 608b, configured to focus the EUV radiation 214, and a reflector 610 configured to reflect the EUV radiation 612 towards the EUV photomask 602. The EUV photomask 602 is configured to reflect the EUV radiation 612 to form a pattern on a surface of a semiconductor workpiece 604. To produce the pattern, the EUV photomask 602 comprises a plurality of absorptive features 614a-614c arranged on a front surface of the EUV photomask 602. The plurality of absorptive features 614a-614c are configured to absorb the EUV radiation 612, such that the reflected rays of EUV radiation 616 conveys a patterned defined by the EUV photomask 602.

The EUV radiation 616 is filtered through reduction optics comprising a series of first through fourth mirrors 618a-618d, which serve as lenses to reduce a size of the pattern carried by the EUV radiation 616. The fourth mirror 618d conveys the EUV radiation 616 onto a on a layer of photoresist disposed on a surface of the semiconductor workpiece 604. The EUV radiation patterns the layer of photoresist so that subsequent processing can be performed on selected regions of the semiconductor workpiece 604.

Figure 7:
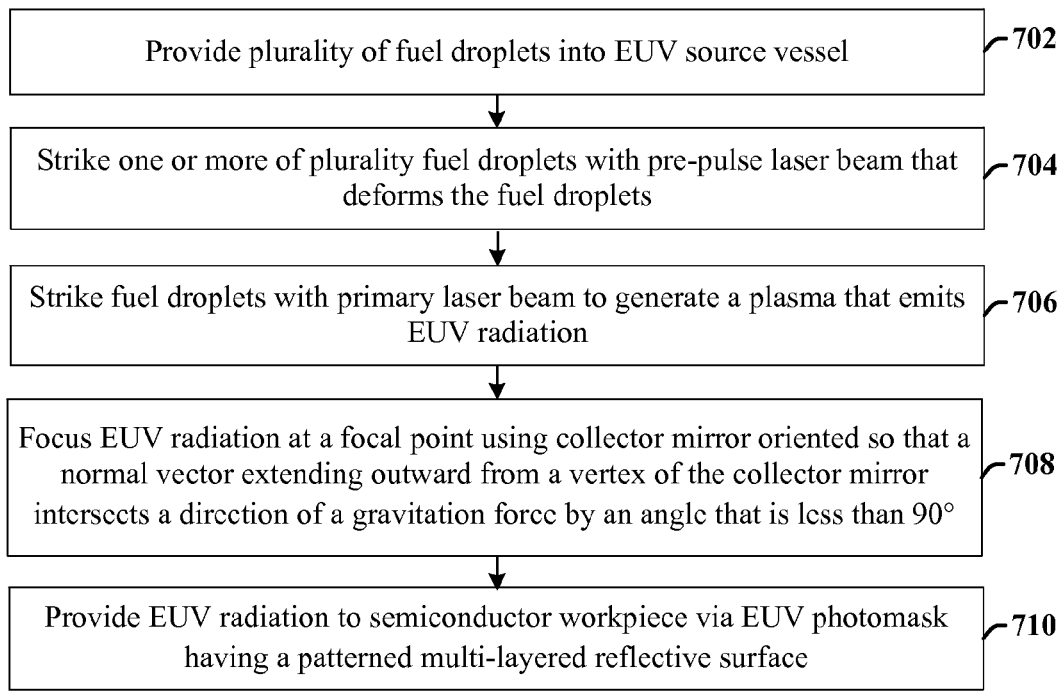
FIG. 7 illustrates a flow diagram of some embodiments of a method of performing an EUV photolithography process.

FIG. 7 illustrates a flow diagram of some embodiments of a method 700 of performing an EUV photolithography process.

While the disclosed method 700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, a plurality of fuel droplets are provided into an EUV source vessel. In some embodiments, the plurality of fuel droplets may comprise tin droplets.

At 704, one or more of the plurality of fuel droplets may be struck with a pre-pulse laser, in some embodiments. The pre-pulse laser is configured to deform or change the shape of the fuel droplets.

At 706, one or more of the plurality of fuel droplets are struck with a primary laser beam. The primary laser beam ignites a plasma from the fuel droplets that emits extreme ultraviolet (EUV) radiation. In some embodiments, the primary laser beam may comprise a laser beam generated by a carbon dioxide ($CO_2$) laser.

At 708, the EUV radiation is focused at a focal point using collector mirror oriented so that a normal vector extending outward from a vertex of the collector mirror intersects a direction of a gravitation force by an angle that is less than 90°

At 710, the EUV radiation is provided to a workpiece via an EUV photomask (e.g., reticle) having a patterned multi-layered reflective surface (e.g., comprising alternating layers of molybdenum and silicon).

Therefore, the present disclosure relates to an extreme ultraviolet (EUV) radiation an source having a collector mirror oriented to reduce contamination by fuel droplet debris, and an associated method In some embodiments, the present disclosure relates to an extreme ultraviolet (EUV) radiation source. The EUV radiation source comprises a fuel droplet generator configured to provide a plurality of fuel droplets to an EUV source vessel. The EUV radiation source further comprises a primary laser configured to generate a primary laser beam directed towards the plurality of fuel droplets, wherein the primary laser beam has a sufficient energy to ignite a plasma that emits extreme ultraviolet radiation from the plurality of fuel droplets. The EUV radiation source further comprises a collector mirror configured to focus the extreme ultraviolet radiation to an exit aperture of the EUV source vessel, wherein the collector mirror is oriented so that a normal vector extending outward from a vertex of the collector mirror intersects a direction of a gravitation force by an angle that is less than 90°.

In other embodiments, the present disclosure relates to an EUV radiation source. The EUV radiation source comprises a tin droplet generator configured to provide a plurality of tin droplets to an EUV source vessel. The EUV radiation source further comprises a carbon dioxide ($CO_2$) laser configured to generate a primary laser beam, wherein the primary laser beam has a sufficient energy to ignite a plasma that emits extreme ultraviolet radiation from the plurality of tin droplets. The EUV radiation source further comprises a collector mirror configured to focus the extreme ultraviolet radiation to an exit aperture of the EUV source vessel, wherein the collector mirror has a vertex that is located at a position that is laterally adjacent to and vertically above an intersection of the plurality of tin droplets and the primary laser beam.

In yet other embodiments, the present disclosure relates to a method of generating extreme ultraviolet (EUV) radiation. The method comprises providing a plurality of fuel droplets into an EUV source vessel, and striking the plurality of fuel droplets with a primary laser beam to generate a plasma that emits EUV radiation. The method further comprises focusing the EUV radiation at a focal point using collector mirror oriented so that a normal vector extending outward from a vertex of the collector mirror intersects a direction of a gravitation force by an angle that is less than 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source, comprising:
   a fuel droplet generator configured to provide a plurality of fuel droplets to an EUV source vessel along a first trajectory;

a primary laser configured to generate a primary laser beam directed towards the plurality of fuel droplets, wherein the primary laser beam has a sufficient energy to ignite a plasma that emits extreme ultraviolet radiation from the plurality of fuel droplets;

a collector mirror that is symmetric about a vertex and that is configured to focus the extreme ultraviolet radiation to an exit aperture of the EUV source vessel located below the collector mirror, wherein the collector mirror is oriented at a first orientation that causes a normal vector extending outward from the vertex of the collector mirror to intersect a vector of a gravitation force by an angle that is less than 90° and further causes a horizontal line extending through the vertex of the collector mirror to overlie an intersection of the first trajectory and the primary laser beam; and wherein the collector mirror has an opening extending through the vertex, and the first orientation of the collector mirror further causes the primary laser beam to extend along the normal vector through the opening from a position overlying the vertex.

2. The EUV radiation source of claim 1, wherein the plurality of fuel droplets are provided to the EUV source vessel along the first trajectory that intersects the normal vector by an angle that is less than 90°.

3. The EUV radiation source of claim 1, further comprising:
a pre-pulse laser configured to generate a pre-pulse laser beam, having a lower energy than the primary laser beam, that deforms the plurality of fuel droplets prior to the primary laser beam hitting the plurality of fuel droplets; and
wherein the pre-pulse laser beam extends in a first direction that is not parallel to a direction of the primary laser beam, and wherein the direction of the primary laser beam is substantially parallel to an optical axis of the collector mirror.

4. The EUV radiation source of claim 1, further comprising:
a fuel droplet collection element located below the fuel droplet generator, wherein the fuel droplet generator and the fuel droplet collection element are aligned along a line that intersects the normal vector by an angle that is less than 90°.

5. The EUV radiation source of claim 4,
wherein a topmost point of the collector mirror is arranged above the intersection of the first trajectory and the primary laser beam and is separated from the fuel droplet generator by a first lateral distance, and
wherein a bottommost point of the collector mirror is arranged below the intersection of the first trajectory and the primary laser beam and is separated from the fuel droplet collection element by a second lateral distance that is larger than the first lateral distance.

6. The EUV radiation source of claim 1, further comprising:
a tin droplet collection element having an angled surface arranged within an interior of the EUV source vessel vertically below the collector mirror, wherein a vertical distance between the angled surface and a bottom of the collector mirror increases as a lateral distance between the angled surface and the bottom of the collector mirror increases.

7. The EUV radiation source of claim 6, further comprising:
an intermediate focus unit comprising a cone shaped aperture arranged within the exit aperture between the EUV source vessel and a downstream scanner comprising a plurality of optical elements configured to convey the extreme ultraviolet radiation to a semiconductor workpiece.

8. The EUV radiation source of claim 1, wherein the collector mirror is positioned at a location that is laterally adjacent to and vertically above the intersection of the first trajectory and the primary laser beam.

9. The EUV radiation source of claim 1, wherein the vertex of the collector mirror is arranged vertically above the intersection and a bottommost point of the collector mirror is located vertically below the intersection.

10. The EUV radiation source of claim 1, further comprising:
a debris collection element having one or more angled corrugated surfaces extending between the collector mirror and the exit aperture.

11. The EUV radiation source of claim 1, further comprising:
a debris collection element having one or more angled corrugated surfaces arranged between the plasma and the EUV source vessel; and
a fuel droplet collection element arranged between the debris collection element and the plasma.

12. The EUV radiation source of claim 1, further comprising:
a debris collection element having a lower angled surface and an upper angled surface that are configured to collect debris from the plasma, wherein the lower angled surface continuously extends from below the collector mirror to a location that is laterally between the plasma and the exit aperture, and wherein the lower angled surface intersects the vector of the gravitation force by a second angle that is less than 90°.

13. The EUV radiation source of claim 12, wherein the second angle is larger than the angle.

14. A method of generating extreme ultraviolet (EUV) radiation, comprising:
providing a plurality of fuel droplets into an EUV source vessel;
striking the plurality of fuel droplets with a primary laser beam at an intersection to generate a plasma that emits EUV radiation;
focusing the EUV radiation at a focal point using a collector mirror oriented at a first orientation that causes a normal vector extending outward from a vertex of the collector mirror to intersect a vector of a gravitation force by an angle that is less than 90°, wherein the first orientation further causes the vertex to overlie the intersection and the normal vector to further intersect an exit aperture of the EUV source vessel located below the collector mirror; and
wherein the collector mirror has an opening extending through the vertex of the collector mirror, and wherein the first orientation of the collector mirror further causes the primary laser beam to extend from a position overlying the vertex and through the opening along the normal vector.

15. The method of claim 14, further comprising:
striking the plurality of fuel droplets with a pre-pulse laser beam that deforms the plurality of fuel droplets prior to striking the plurality of fuel droplets with the primary laser beam, wherein the pre-pulse laser beam extends in a direction that is not parallel to a direction of the primary laser beam.

16. The method of claim 14, further comprising:
providing the EUV radiation to a semiconductor workpiece via an EUV photomask having a patterned multi-layered reflective surface.

17. An extreme ultraviolet (EUV) radiation source, comprising:
a fuel droplet generator configured to provide a plurality of fuel droplets to an EUV source vessel along a first trajectory substantially extending in a same direction as a vector of a gravitation force;
a primary laser configured to generate a primary laser beam directed towards the plurality of fuel droplets, wherein the primary laser beam has a sufficient energy to ignite the plurality of fuel droplets to generate a plasma that emits extreme ultraviolet radiation;
a collector mirror oriented so that a normal vector extending outward from a vertex of the collector mirror intersects the vector of the gravitation force by an angle that is less than 90°, wherein the normal vector intersects an exit aperture of the EUV source vessel that is located below the collector mirror; and
wherein the primary laser beam is configured to intersect the first trajectory at an intersection point that is located vertically below a horizontal line extending through the vertex of the collector mirror and wherein an uppermost point of the exit aperture is located below the intersection point.

18. The EUV radiation source of claim 17,
wherein a topmost point of the collector mirror is arranged above the intersection point and is separated from the fuel droplet generator by a first lateral distance, and
wherein a bottommost point of the collector mirror is arranged below the intersection point and is separated from a fuel droplet collection element by a second lateral distance that is larger than the first lateral distance.

19. The EUV radiation source of claim 17,
wherein the collector mirror has an opening extending through the collector mirror at a location that is offset from the vertex of the collector mirror; and
wherein the primary laser beam extends through the opening along a second trajectory that intersects the first trajectory at a substantially perpendicular angle.

20. The EUV radiation source of claim 17, wherein the vertex of the collector mirror is arranged vertically above the intersection point and a bottommost point of the collector mirror is located vertically below the intersection point.

* * * * *